(12) United States Patent
Ohsawa et al.

(10) Patent No.: US 7,649,143 B2
(45) Date of Patent: Jan. 19, 2010

(54) WIRED-CIRCUIT-BOARD ASSEMBLY SHEET

(75) Inventors: Tetsuya Ohsawa, Osaka (JP); Kouji Kataoka, Osaka (JP); Yoshihiko Takeuchi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 225 days.

(21) Appl. No.: 11/654,547

(22) Filed: Jan. 18, 2007

(65) Prior Publication Data
US 2007/0170911 A1 Jul. 26, 2007

(30) Foreign Application Priority Data
Jan. 25, 2006 (JP) ............................. 2006-016492

(51) Int. Cl.
*H05K 1/00* (2006.01)
(52) U.S. Cl. ..................... 174/254; 360/245.9
(58) Field of Classification Search ................ 174/254, 174/244; 360/245.9
See application file for complete search history.

(56) References Cited
U.S. PATENT DOCUMENTS
6,202,288 B1 * 3/2001 Shiraishi et al. ........... 29/603.03

6,891,108 B2 * 5/2005 Prindiville et al. .......... 174/255
7,081,590 B2 * 7/2006 Yuzawa ....................... 174/250
7,402,755 B2 * 7/2008 Chen et al. .................. 174/250

FOREIGN PATENT DOCUMENTS
JP 2000-151044 5/2000

* cited by examiner

Primary Examiner—Ishwar (I. B.) Patel
(74) Attorney, Agent, or Firm—Jean C. Edwards, Esq.; Akerman Senterfitt

(57) ABSTRACT

A wired-circuit-board assembly sheet is provided having removable portions that are easily removable without any generation of metal powder. The wired-circuit-board assembly sheet comprises a plurality of suspension boards with circuits, distinguishing marks for distinguishing defectiveness of the suspension boards with circuits, and a supporting sheet for supporting the suspension boards with circuits and the distinguishing marks, wherein openings are formed in the supporting sheet, and removable portions which are to be removed when the suspension boards with circuits are judged defective are located in the openings and also supported by the supporting sheet via joint portions formed of resin.

6 Claims, 7 Drawing Sheets

(a)

(b)

(c)

(d)

US 7,649,143 B2

WIRED-CIRCUIT-BOARD ASSEMBLY SHEET

CROSS REFERENCE TO RELATED APPLICATION

This application claims priority benefits on the basis of Japanese Patent Application No. 2006-016492 filed on Jan. 25, 2006, the disclosure of which is incorporated herein by reference.

BACKGROUND OF THE INVENTION

1. Field of the Invention

The present invention relates to a wired-circuit-board assembly sheet.

2. Description of the Prior Art

A suspension board with circuit mounted on a hard disc drive commonly comprises a metal supporting layer, an insulating base layer formed on the metal supporting layer, a conductive pattern formed on the insulating base layer, and an insulating cover layer formed on the insulating base layer for covering the conductive pattern. This suspension board with circuit is produced in the form of a suspension-board-with-circuit assembly sheet wherein a plurality of suspension boards with circuits are formed on a single sheet of metal supporting board.

Specifically, the suspension-board-with-circuit assembly sheet is produced in the manner that the insulating base layer, the conductive pattern, and the insulating cover layer are formed in sequence on a sheet of metal supporting board in the aligned state to correspond with each suspension board with circuit. Thereafter, the metal supporting board is sectionally cut out to correspond to an outline of each suspension board with circuit so as to form a suspension board with circuit and a supporting sheet for supporting the suspension board with circuit. Thus, the suspension board with circuit is produced in the form of a suspension-board-with-circuit assembly sheet wherein a number of suspension boards with circuit are formed in the aligned state on a single sheet of metal supporting board.

Then, each suspension board with circuit is properly cut off from the suspension-board-with-circuit assembly sheet for wide use in a variety of electric and electronic devices.

It is known that, in such suspension-board-with-circuit assembly sheet, defectiveness distinguishing marks are provided for each of the suspension board with circuit for distinguishing defectiveness of a marked suspension board with circuit.

For example, Japanese Unexamined Patent Publication No. 2000-151044 proposes that condemnation marks (the distinguishing marks) are formed in a wired-suspension-board sheet having wired suspension boards. These condemnation marks comprise a bridge of a very small width comprising a polyimide layer, a copper foil and a stainless steel foil, and a metal piece held by the bridge and are formed such as to correspond to each of the wired suspension boards. When a certain wired suspension board is judged to contain a broken wire, the condemnation mark for the related wired suspension board is taken out or removed by tearing off the bridge of the condemnation mark, while vacuuming up the metal piece of the condemnation mark in order to distinguish such a defective wired suspension board containing the broken wire from non-defective wired suspension boards by the removal of the condemnation mark (distinguishing mark).

However, this wired-suspension-board sheet described in Japanese Unexamined Patent Publication No. 2000-151044 has a problem that when the metal piece of the condemnation mark is removed, the bridge of the condemnation mark comprising the copper foil and the stainless steel foil is torn off, due to which metal powders of copper and stainless steel are easily generated, so that there is a possibility that the metal powders generated may adversely affect the electrical property of the wired suspension board.

Further, since the bridge comprises the copper foil and the stainless steel foil, it may be difficult to tear off the bridge by vacuuming.

On the other hand, when the metal piece of the condemnation mark is punched or stamped out using a metal stamp tool, although the bridge may be torn off with ease, however, the metal stamp tool is subject to abrasion by the friction between the copper foil and the stainless steel foil.

SUMMARY OF THE INVENTION

It is an object of the present invention to provide a wired-circuit-board assembly sheet having removable portions that are easily removable without any generation of metal powder.

The present invention provides a wired-circuit-board assembly sheet comprising a plurality of wired circuit boards, distinguishing marks for distinguishing defectiveness of the wired circuit boards, and a supporting sheet for supporting the wired circuit boards and the distinguishing marks, wherein openings are formed in the supporting sheet where the distinguishing marks are provided, and the distinguishing marks include removable portions provided in the openings for indicating whether the wired circuit boards are defective or non-defective, and joint portions formed of resin for joining the removable portions and the supporting sheet.

According to the wired-circuit-board assembly sheet of the present invention, since the joint portions for joining the removable portion and the supporting sheet are formed of resin, when a removable portion is removed to indicate that a wired circuit board is defective or non-defective, the removal portion in the opening can be removed from the supporting sheet with ease by simply cutting the joint portions. In addition, since no metal powder is generated when the joint portions are cut off, the electrical property of the wired circuit board can be maintained well. Further, when the removal portion is removed by stamping out using a metal stamp tool, the metal stamp tool can be reduced in abrasion. As a result of these, easy and reliable removal of the removal portion can be provided and hence the wired circuit board of high connecting reliability can be obtained.

In the wire-circuit-board assembly sheet of the present invention, it is preferable that the wired circuit board comprises a metal supporting layer, an insulating base layer formed on the metal supporting layer, a conductive pattern formed on the insulating base layer, and an insulating cover layer formed on the insulating base layer to cover the conductive pattern, wherein the supporting sheet comprises the metal supporting layer, and the joint portion comprises the insulating base layer and/or the insulating cover layer.

According to this configuration, the wired circuit board and the supporting sheet can both be formed from the common metal supporting layer. Further, the wired circuit board and the joint portions can both be formed from the common insulating base layer and/or the common insulating cover layer. As a result of this, the production processes can be simplified and the wire-circuit-board assembly sheet can be produced with an increased production efficiency.

In the wired-circuit-board assembly sheet of the present invention, it is preferable that the joint portion each comprises a supporting-sheet-side end portion connected to the supporting sheet, and a removable-portion-side end portion connected to the removable portion, wherein at least either of the supporting-sheet-side end portion and the removable-portion-side end portion has a curved portion formed to generally increase in width from inside to outside in a curved form in a direction in which the supporting-sheet-side end portion and the removable-portion-side end portion are opposite to each other.

Since each joint portion is often subject to stress concentration at the supporting-sheet-side end portion thereof and the removable-portion-side end portion thereof, there is a possibility that the joint portion may be cut off when the removable portion is not intended to be removed.

However, when the curved portion is formed in at least either of the supporting-sheet-side end portion and the removable-portion-side end portion as specified by the present invention, there can be provided an advantage that when at least either of the supporting-sheet-side end portion and the removable-portion-side end portion is stressed, the stress can be dispersed over the curved portion. On the other hand, when the removable portion is intended to be removed, the joint portions can be cut off on the inner side by exerting stress on inward portions thereof in the direction in which the supporting-sheet-side end portion and the removable-portion-side end portion are opposite to each other. Thus, when the removable portion is not intended to be removed, the joint portions can be cut off difficulty, while on the other hand, when the removable portion is intended to be removed, the joint portions can be cut off reliably.

In the wired-circuit-board assembly sheet of the present invention, it is preferable that the distinguishing mark comprises an outer frame portion formed of resin which is provided to extend continuously from the joint portion to surround the opening, wherein the outer frame portion is formed to expose an end portion of the opening in the supporting sheet.

When the outer frame portion is formed to expose the end portion of the opening in the supporting sheet, the joint portions extending continuously with the outer frame portion can be cut off with ease and reliability.

In the wired-circuit-board assembly sheet of the present invention, it is preferable that the joint portion comprises a supporting-sheet-side end portion connected to the supporting sheet, and a removable-portion-side end portion connected to the removable portion and are formed to generally decrease in width from the supporting-sheet-side end portion to the removable-portion-side end portion or from the removable-portion-side end portion to the supporting-sheet-side end portion.

In the case where an intermediate portion of between the supporting-sheet-side end portion to the removable-portion-side end portion of the joint portion is formed equal in width, when the removable portion is removed by cutting off the joint portions, the locations where the intermediate portions of the joint portions are cut may vary, so that it may be difficult to the removable portions may be dealt with in uniformity.

In contrast to this, when the joint portions are formed to generally decrease in width from the supporting-sheet-side end portion to the removable-portion-side end portion, they can be easily cut off at the removable-portion-side end portions in uniformity. On the other hand, when the joint portions are formed to generally decrease in width from the removable-portion-side end portion to the supporting-sheet-side end portion, they can be easily cut off at the supporting-sheet-side end portion in uniformity. Thus, the removable portions can be dealt with by removing them in uniformity.

In the wired-circuit-board assembly sheet of the present invention, it is preferable that the wired circuit board is a suspension board with circuit.

DETAILED DESCRIPTION OF THE PREFERRED EMBODIMENTS

Figure 1:
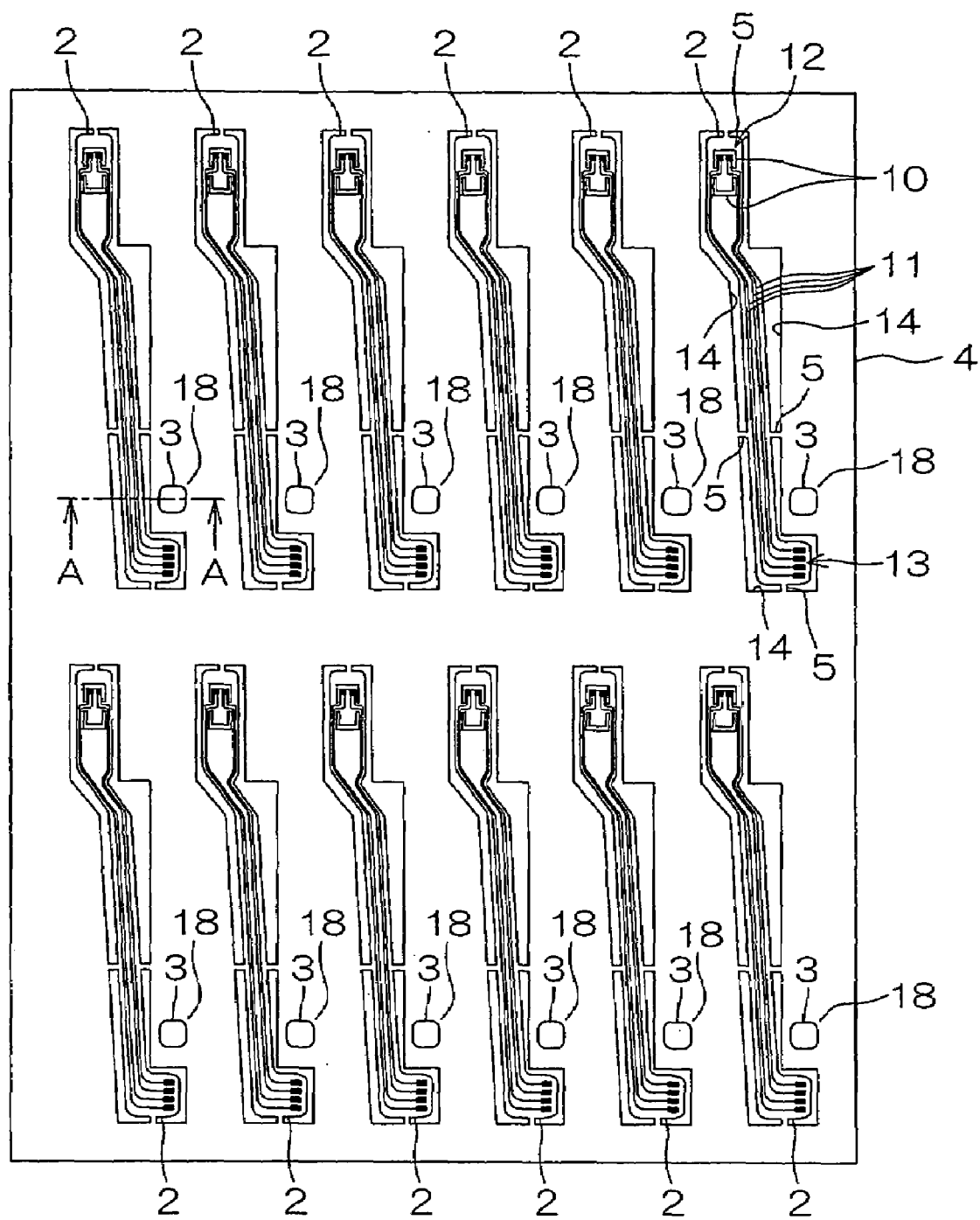
FIG. 1 is a plan view showing a suspension-board-with-circuit assembly sheet of an embodiment of a wired-circuit-board assembly sheet of the present invention.
Figure 2:
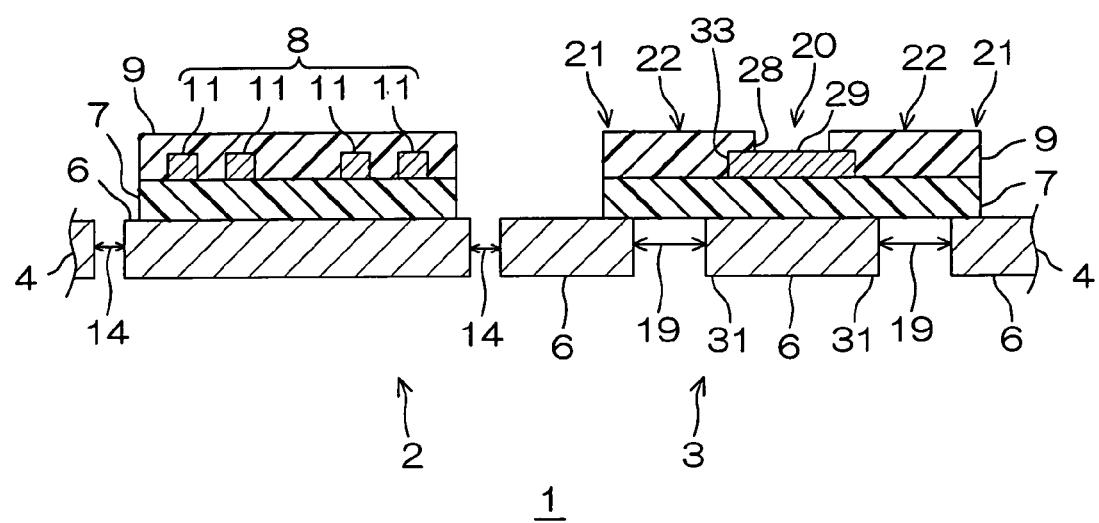
FIG. 2 is a sectional view of the suspension-board-with-circuit assembly sheet shown in FIG. 1 taken along line A-A.
Figure 3:
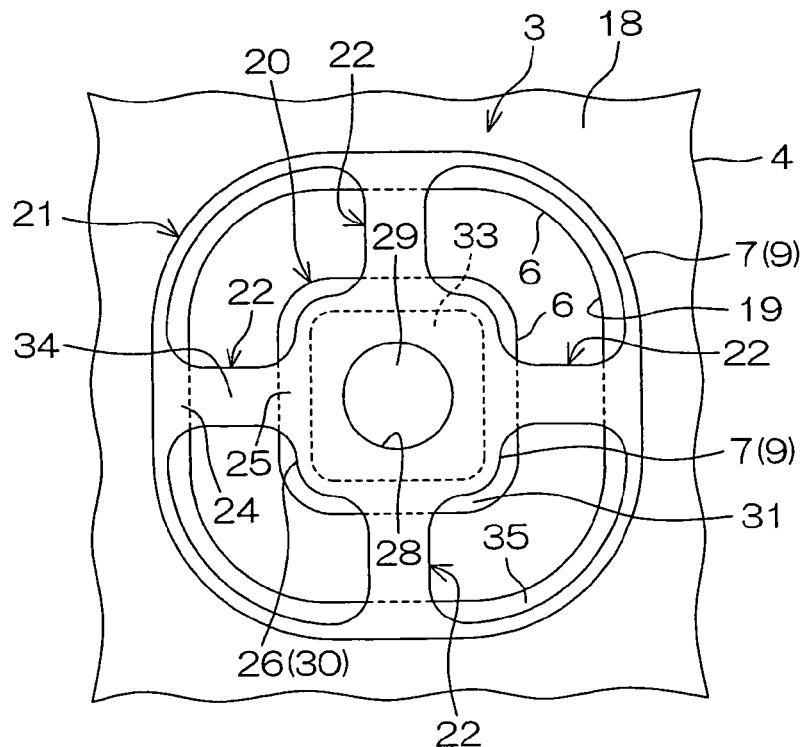
FIG. 3 is an enlarged plan view of a distinguishing mark provided on the suspension-board-with-circuit assembly sheet shown in FIG. 1.
Figure 4:
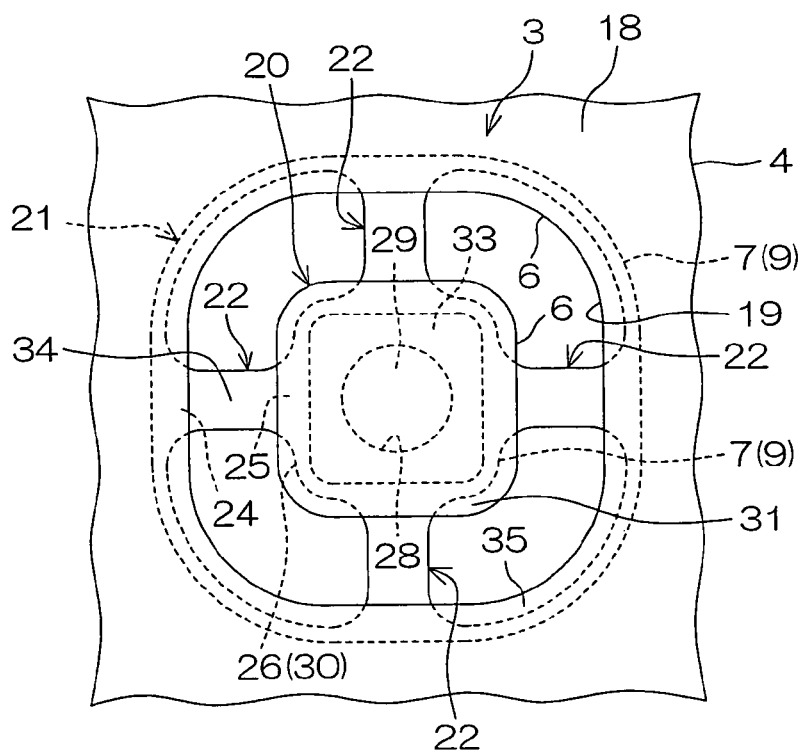
FIG. 4 is an enlarged rear view of the distinguished mark shown in FIG. 3.

FIG. 1 is a plan view showing a suspension-board-with-circuit assembly sheet of an embodiment (a first embodiment) of a wired-circuit-board assembly sheet of the present invention. FIG. 2 is a sectional view of the suspension-board-with-circuit assembly sheet shown in FIG. 1 taken along line A-A. FIG. 3 is an enlarged plan view of a distinguishing mark provided on the suspension-board-with-circuit assembly sheet shown in FIG. 1. FIG. 4 is an enlarged rear view of the distinguished mark shown in FIG. 3. In FIG. 1, an insulating base layer 7 and an insulating cover layer 9 as will be mentioned later are omitted.

The suspension-board-with-circuit assembly sheet 1 shown in FIG. 1 comprises a plurality of suspension boards with circuits 2 as in the form of a plurality of wired circuit boards, distinguishing marks 3, and a supporting sheet 4 for supporting the suspension boards with circuits 2, and the distinguishing marks 3.

The suspension boards with circuits 2 are spaced apart from each other in the aligned state on the supporting sheet 4, and supported on the supporting sheet 4 through cuttable supporting portions 5, respectively.

The suspension boards with circuits 2 are each designed to mount a magnetic head of a hard disc drive (not shown) thereon and hold the magnetic head against an airflow generated when the magnetic head and a magnetic disk (not shown) run relative to each other, while supporting the magnetic head closely spaced from the magnetic disc. A conductive pattern 8 to connect between the magnetic head and a read/write board (not shown) is integrally formed on the suspension board with circuit.

The conductive pattern 8, which will be mentioned later, integrally includes magnetic-head-side connecting terminals 12 for connecting with connecting terminals of the magnetic head, external side connecting terminals 13 for connecting with connecting terminals of a read/write board, and wires 11 for connecting between the magnetic-head-side connecting terminals 12 and the external connecting terminals 13.

As shown in FIG. 2, each suspension board with circuit 2 comprises a metal supporting layer 6, an insulating base layer 7 formed on the metal supporting layer 6, the conductive pattern 8 formed on the insulating base layer 7, and an insulating cover layer 9 formed on the insulating base layer 7 to cover the conductive pattern 8.

The metal supporting layer 6 is formed from a metal supporting board 17 (see FIG. 5(a)) together with the supporting sheet 4 mentioned later. The metal supporting layer 6 is formed from a thin, flat strip-shaped plate and is shaped to correspond to the suspension board with circuit 2. Gimbals 10 in which the magnetic head is mounted are formed on the metal supporting layer 6 of the suspension board with circuit 2. The gimbals 10 are formed at a front end portion of the suspension board with circuit 2 to sandwich the magnetic head terminals 12 therebetween. The metals that are used for forming the metal supporting board 17 including the metal supporting layer 6 include, for example, stainless steel and 42-alloy. Preferably, stainless steel is used for the metal supporting board 17. The metal supporting board 17 has a thickness of e.g. 10-100 µm, or preferably 8-50 µm.

The insulating base layer 7 is formed on the metal supporting layer 6 to be in the form of a pattern corresponding to a portion where the conductive pattern 8 is formed. Insulating materials that may be used for forming the insulating base layer 7 include, for example, synthetic resins, such as, polyimide resin, acrylic resin, polyether nitrile resin, polyether sulfone resin, polyethylene terephthalate resin, polyethylene naphthalate resin, and polyvinyl chloride resin. Of these synthetic resins, photosensitive synthetic resin is used for forming the insulating base layer 7 in the pattern. Further preferably, photosensitive polyimide resin is used for the insulating base layer 7. The insulating base layer 7 has a thickness of e.g. 3-30 m, or preferably 5-15 µm.

As shown in FIG. 1, the conductive pattern 8 integrally includes the plurality of wires 11 arranged in parallel and spaced apart from each other, the magnetic-head-side connecting terminals 12 extending continuously from front ends of the wires 11, respectively, and the external side connecting terminals 13 extending continuously from rear ends of the wires 11, respectively. Conductors that may be used for forming the conductive pattern 8 include, for example, metal foils, such as copper, nickel, gold, solder, or alloys thereof. Of these metals, copper foil is preferably used for the conductive pattern 8 in terms of conductivity, inexpensiveness, and workability. The conductive pattern 8 has a thickness of e.g. 3-20 µm, or preferably 7-15 µm. Also, a width of each of the wires 11 is in a range of e.g. 5-500 µm, or preferably 10-200 µm, and a space between adjacent lines of each of the wires 11 is in the range of e.g. 5-500 µm, or preferably 10-200 µm.

As shown in FIG. 2, the insulating cover layer 9 on the insulating base layer 7 is formed in the form of a pattern to cover the wires 11, and expose the magnetic-head-side connecting terminals 12 and the external connecting side terminals 13. The same insulating materials as those used for forming the insulating base layer 7 are used for forming the insulating cover layer 9. Preferably, the photosensitive polyimide resin is used. The insulating cover layer 9 has a thickness of e.g. 2-20 µm, or preferably 4-15 µm.

As shown in FIGS. 1 and 2, in the production method of the suspension-board-with-circuit assembly sheet 1 mentioned later, the supporting sheet 4 is formed together with each of the supporting portions 5 and each of the supporting layers 6 by cutting out the metal supporting board 17 partially to correspond to an outline of each of the suspension boards with circuits 2.

In addition, slits 14 shaped like a frame as viewed from top are also formed to surround each of the suspension boards with circuits 2 in the supporting sheet 4 at its regions defined between inner peripheries of the supporting sheet 4 and outer peripheries of each of the suspension boards with circuits 2. Usually, each slit 14 is set to have a width of 0.1-10 mm.

Further, a number of supporting portions 5 are formed in the supporting sheet 4 to intersect the slits 14. Each supporting portion 5 is formed in a rectangular shape as viewed from top, and is formed to extend from the inner periphery of the supporting sheet 4 to the outer periphery of the suspension board with circuit 2 such as to pass across the slit 14 in a direction orthogonal to the slit 14. Usually, each supporting portion 5 is set to have a width of 80-300 µm, or preferably 200-300 µm. The forming locations and the number of supporting portions 5 can be properly determined depending on the size and shape of the suspension board with circuit 2.

Further, distinguishing mark forming regions 18 are formed in the supporting sheet 4 at locations where the distinguishing marks 3 are provided.

The distinguishing mark forming regions 18 are provided corresponding to the respective suspension boards with circuits 2 and are located at spaced intervals at lateral sides of the suspension boards with circuits 2. Openings 19 are formed in these distinguishing mark forming regions 18, as shown in FIGS. 3 and 4.

The openings 19 are in a generally square form having rounded corners as viewed from top, and are formed to open the supporting sheet 4. Each opening 19 is set to have a length of e.g. 1,000-3,000 µm, or preferably 1,500-2,500 µm, on a side.

The distinguishing marks 3 are for distinguishing defectiveness of the suspension board with circuit and are provided in the distinguishing mark forming regions 18.

Each distinguishing mark 3 comprises a removable portion 20, an outer frame portion 21, and joint portions 22.

The removable portion 20 is for indicating non-defectiveness of the related suspension board with circuit 2. The removable portion 20 is located at a generally center portion of the opening 19 and is formed to have a similar figure slightly smaller than the opening 19 and a generally square form having rounded corners.

As shown in FIG. 2, the removable portion 20 comprises the metal supporting layer 6, the insulating base layer 7 formed on the metal supporting layer 6, a mark forming portion 33 formed on the insulating base layer 7, and the insulating cover layer 9 formed on the insulating base layer 7 to cover a part of the mark forming portion 33.

As shown in FIGS. 3 and 4, the metal supporting layer 6 at the removable portion 20 is formed in a shape corresponding to an outer shape of the removable portion 20 or in a generally square shape having rounded corners as viewed from top.

The insulating base layer 7 at the removable portion 20 is formed on the metal supporting layer 6 to have a similar figure slightly smaller than the metal supporting layer 6 and a generally square form having rounded corners as viewed from top. The insulating base layer 7 thus formed exposes the marginal portion 31 of the metal supporting layer 6 from outer peripheries 26 of the insulating base layer 7, except the joint portions 22, described later.

The mark forming portion 33 is formed on the insulating base layer 7 to have a similar figure slightly smaller than the insulating base layer 7 and a generally square form having rounded corners as viewed from top. The mark forming portion 33 is integrally provided at a center thereof as viewed from top, with a non-defectiveness distinguishing mark 29 exposed from an opening 28 of the insulating cover layer 9 mentioned later. A metal plated layer (not shown) comprising gold is formed on a front surface of the non-defectiveness distinguishing mark 29.

As shown in FIG. 2, the insulating cover layer 9 at the removable portion 20 is formed on the insulating base layer 7 to cover the mark forming portion 33 and expose the non-defectiveness distinguishing mark 29. As shown in FIGS. 3 and 4, the insulating cover layer 9 is formed to have substantially the same shape as the insulating base layer 7 and a generally square form having rounded corners as viewed from top. The insulating cover layer 9 thus formed exposes the marginal portion 31 of the metal supporting layer 6 from the outer peripheral surfaces 30 of the insulating cover layer 9 except the joint portions 22.

The insulating cover layer 9 has the opening 28 in circular form as viewed from top formed at a center thereof to expose the non-defectiveness mark 29 therefrom.

The metal supporting layer 6 at the removable portion 20 is set to be a length of e.g. 500-2,500 μm, or preferably 1,000-2,000 μm, on a side. The insulating base layer 7 and the insulating cover layer 9 are set to have a length of e.g. 250-2,300 μm, or preferably 500-1,500 μm, on a side. The mark forming portion 33 is set to have a length of e.g. 150-2,000 μm, or preferably 350-1,300 μm, on a side. The non-defectiveness mark 29 is set to have a diameter of e.g. 100-1,500 μm, or preferably 200-800 μm.

The outer frame portion 21 is provided on the supporting sheet 4 continuously in a circumferential direction to surround the opening 19 of the supporting sheet 4. The outer frame portion 21 is formed in a generally square shape having rounded corners as viewed from top. The outer frame portion 21 thus formed exposes a marginal portion 35 of the opening 19 as a peripheral edge portion of the opening at the supporting sheet 4, except the joint portions 22. Further, the outer frame portion 21 is formed of the insulating base layer 7 and the insulating cover layer 9, as shown in FIG. 2.

The insulating base layer 7 at the outer frame portion 21 is formed in a shape to correspond to the outer shape of the outer frame portion 21.

The insulating cover layer 9 at the outer frame portion 21 is formed in a shape identical to the insulating base layer 7 on the insulating base layer 7.

The outer frame portion 21 is set to have a width of e.g. 50 μm or more, or preferably 80 μm or more with respect to a direction orthogonal to the circumferential direction. A margin of the exposed peripheral edge portion 35 of the opening 19 (a space between the inside surface of the outer frame portion 21 and a peripheral end face of the peripheral edge portion 35 of the opening 19) is set to be e.g. 30-500 μm, or preferably 50-300 μm.

The joint portions 22 are extended between centers of the four sides of the removable portion 20 and centers of the four sides of the outer frame portion 21, respectively, to connect between the removable portion 20 and the supporting sheet 4.

The joint portions 22 are arranged in a generally cross form as viewed from top to center around the non-defectiveness mark 29 of the removable portion 20. Each joint portion 22 is formed to extend between the removable portion 20 and the outer frame portion 21 to pass across the opening 19 in a direction orthogonal to the circumferential direction of the opening 19 exposed from the removable portion 20.

Each of the joint portion 22 is formed by the insulating base layer 7 and the insulating cover layer 9, and is formed to extend continuously from the insulating base layer 7 and the insulating cover layer 9 of the removable portion 20, and, the insulating base layer 7 and the insulating cover layer 9 of the outer frame portion 21, respectively.

Further, the joint portion 22 comprises the removable-portion-side end portion 25 connected to the removable portion 20, the supporting-sheet-side end portion 24 connected to the supporting sheet 4, and a joint center portion 34 connected therebetween.

Each removable-portion-side end portion 25 has a curved portion formed to generally increase in width from the joint center portion 34 to the removable portion 20 in a curved form so as to provide a wider skirt.

Each supporting-sheet-side end portion 24 has a curved portion formed to generally increase in width from the joint center portion 34 to the outer frame portion 21 in a curved form so as to provide a wider skirt.

The joint center portion 34 is formed to be integral with and extend continuously with the removable-portion-side end portion 25 and the supporting-sheet-side end portion 24. The joint center portion 34 is in an elongated flat strip form having the same width to extend between the removable-portion-side end portion 25 and the supporting-sheet-side end portion 24.

The insulating base layer 7 at the joint portions 22 is formed to correspond to the outer shapes of the joint portions 22.

The insulating cover layer 9 at the joint portions 22 is formed on the insulating base layer 7 to correspond in shape to the insulating base layer 7.

The joint portions 22 are set to have a width of e.g. 100-500 μm, or preferably 200-400 μm, with respect to a direction orthogonal to a longitudinal direction of the joint center portion 34.

Figure 5:
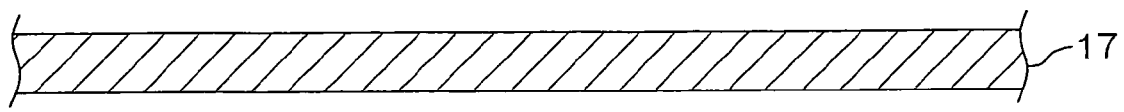
FIG. 5 is a production process drawing showing production processes of the suspension-board-with-circuit assembly sheet, (a) showing the process of preparing a metal supporting board, (b) showing the process of forming a plurality of insulating base layers on the metal supporting board, (c) showing the process of forming a conductive pattern on the insulating base layer of each suspension board with circuit and forming a mark forming portion on the insulating base layer at each distinguishing mark, and (d) showing the process of forming each insulating cover layer on each of the insulating base layers.
Figure 5:
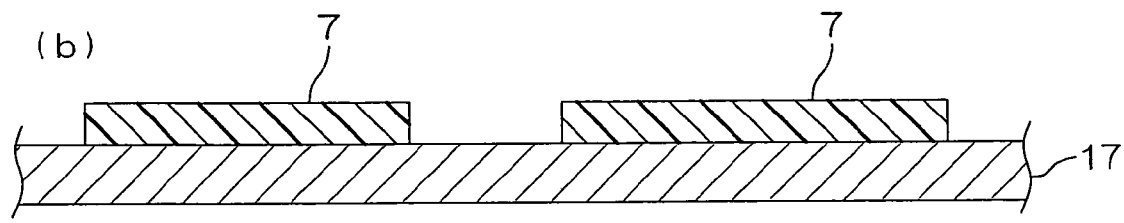
Figure 5:
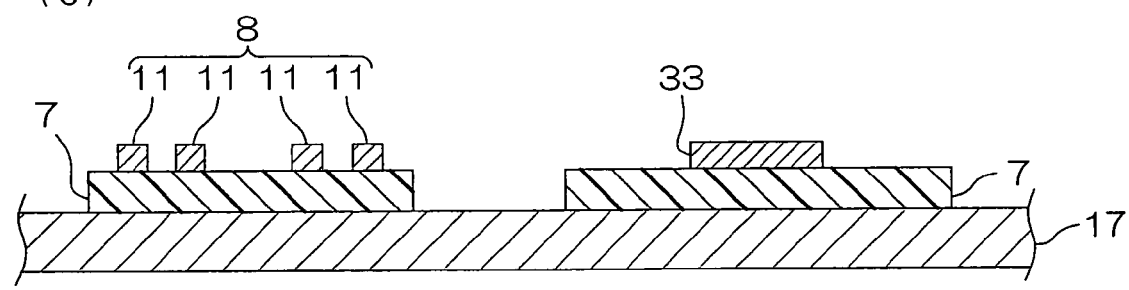
Figure 5:
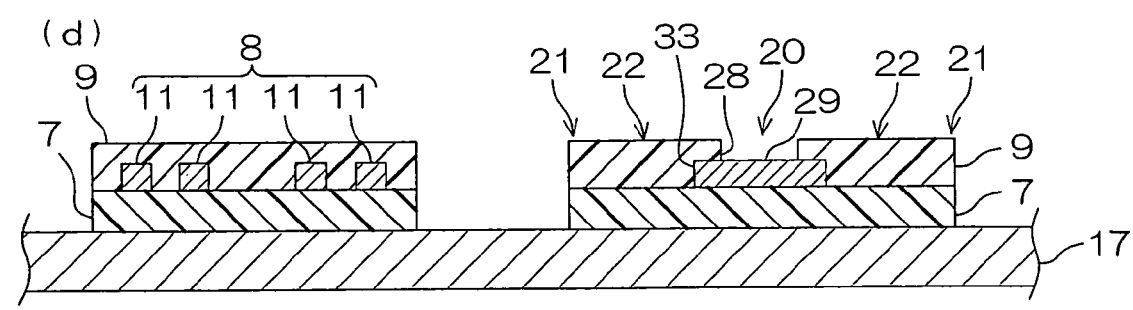
Figure 6:
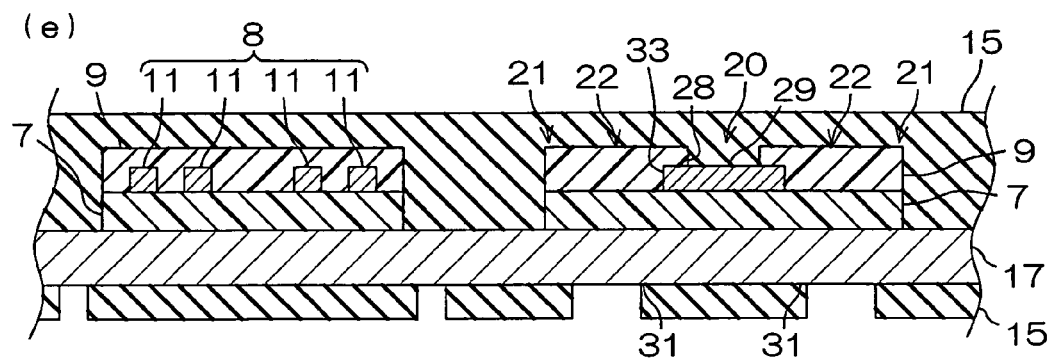
FIG. 6 is a production process drawing showing production processes of the suspension-board-with-circuit assembly sheet subsequent to the processes of FIG. 5, (e) showing the process of forming an etching resist over the entire front surface of the suspension-board-with-circuit assembly sheet which is under production and forming an etching resist on the back side of the same in a predetermined pattern, (f) showing the process of opening the metal supporting board exposed from the etching resist by etching, and (g) showing the process of removing the etching resist.
Figure 6:
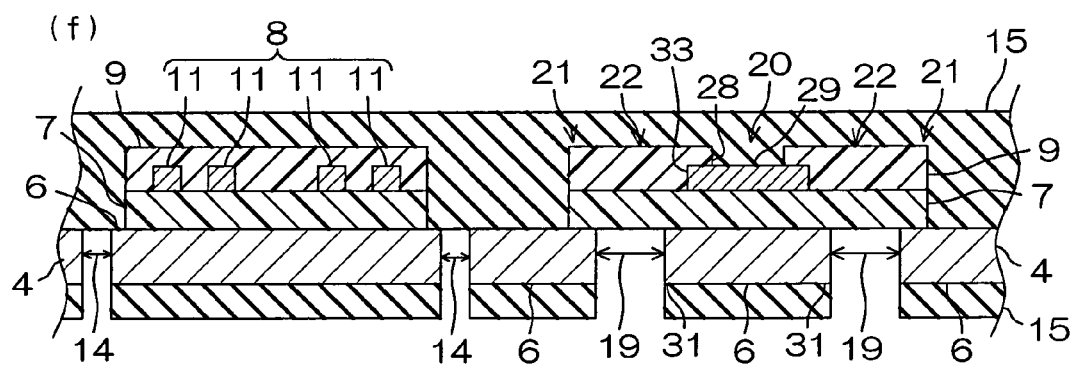
Figure 6:
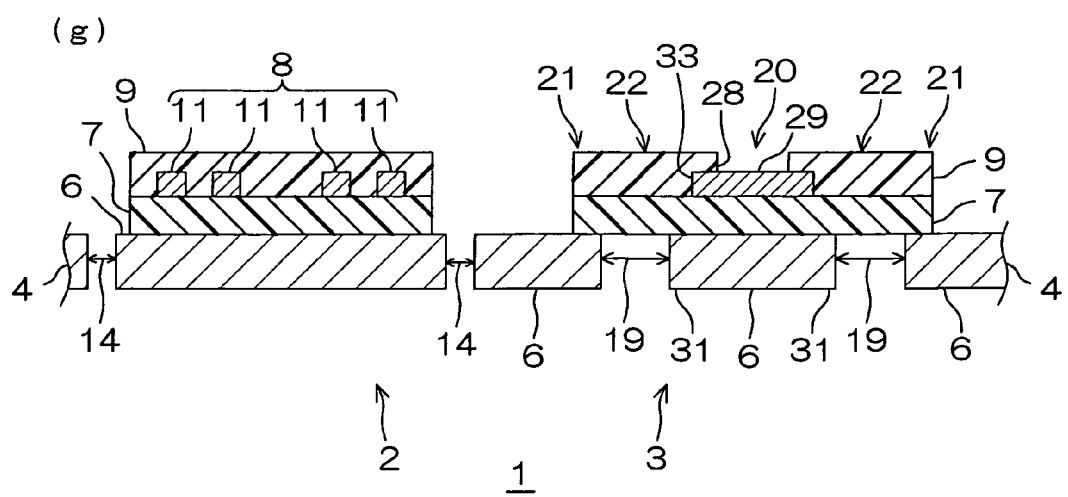

FIGS. 5 and 6 are production process drawings showing production processes of the suspension-board-with-circuit assembly sheet 1.

Referring to FIGS. 5 and 6, a production method of the wired-suspension-board assembly sheet 1 is described below.

First, the metal supporting board 17 is prepared, as shown in FIG. 5(a). Then, the metal supporting board 17 is formed in a generally rectangular flat plate shape as viewed from top, as referred to in FIG. 1.

Then, a plurality of insulating base layers 7 are simultaneously formed on the metal supporting board 17 to have a pattern corresponding to the suspension boards with circuits 2 and each of the distinguishing marks 3, as shown in FIG. 5(b).

In the formation of each of the insulating base layer 7, for example, a solution of synthetic resin (varnish) is coated over the surface of the metal supporting board 17 in the pattern mentioned above, and then dried. Then, it is cured by heat, if necessary. In the case where a photosensitive synthetic resin is used for the insulating base layer 7, the photosensitive synthetic resin is coated over the surface of the metal of metal supporting board 17. Thereafter, the photosensitive synthetic resin is exposed to light and then developed to form the pattern mentioned above. Then, it is cured by heat, if necessary. Further, the method for forming the insulating base layer 7 is not limited to the method mentioned above. The insulating base layer 7 can be formed, for example, by a method that after a synthetic resin is previously formed in a film form having the pattern mentioned above, the resulting film is adhesively bonded to the surfaces of the metal supporting board 17 via a known adhesive layer.

Then, the conductive pattern 8 is formed on the insulating base layer 7 of each suspension board with circuit 2 in the corresponding pattern, while at the same time, the mark forming portion 33 is formed on the insulating base layer 7 of each distinguishing mark 3 in the corresponding pattern, as shown in FIG. 5(c). Each of the conductive patterns 8 and each of the mark forming portions 33 are formed by a known patterning process such as additive process or subtractive process. Preferably, the additive process is used.

Then, the insulating cover layer 9 is formed on the insulating base layer 7 to cover the conductive pattern 8 of each suspension board with circuit 2 and expose the magnetic-head-side connecting terminals 12 and the external side connecting terminals 13, while at the same time, the insulating cover layer 9 is formed on the insulating base layer 7 to cover the mark forming portion 33 of each distinguishing mark 3 and expose the non-defectiveness mark 29, as shown in FIG. 5(d), In the formation of the insulating cover layer 9, for example, the solution of synthetic resin mentioned above is coated in the pattern mentioned above, and then dried. Then, it is cured by heat, if necessary. In the formation of each insulating cover layer 9, the photosensitive synthetic resin is coated over the entire surface of the metal supporting board 17 and insulating base layer 7. Thereafter, the photosensitive synthetic resin is exposed to light and then developed, to form the pattern mentioned above. Then, it is cured by heat, if necessary. Further, the method for forming the insulating cover layer 9 is not limited to the method mentioned above. The insulating cover layer 9 may be formed, for example, by the method that after a synthetic resin is previously formed in a film form having the pattern mentioned above, the resulting film is adhesively bonded to the surfaces of the insulating base layer 7 of the respective suspension boards with circuits 2 and to the insulating base layer 7 of the respective distinguishing marks 3 via a known adhesive layer.

Then, the gimbals 10 of the respective suspension boards with circuits 2, the openings 19 of the respective distinguishing marks 3, and the respective slits 14 of the supporting sheet 4 are formed simultaneously by cutting out the metal supporting board 17, as shown in FIG. 6(e) to (g).

The gimbals 10 of the respective suspension boards with circuits 2, the openings 19 of the respective distinguishing marks 3, and the respective slits 14 of the supporting sheet 4 are formed in the following manner. First, the etching resist 15 is formed on the entire front surface of the suspension-board-with-circuit assembly sheet 1 which is under production, while also the etching resist 15 is formed on the back surface of the suspension-board-with-circuit assembly sheet 1 in the reverse pattern to the pattern in which the gimbals 10 of the respective suspension boards with circuits 2, the openings 19 of the respective distinguishing marks 3, and the respective slits 14 of the supporting sheet 4 are formed.

The etching resist 15 is formed to have the above pattern by a known photosensitive method. For example, after a photosensitive dry film resist is laminated on the entire front surface of the gimbals 10 of the suspension boards with circuits 2 which is under production and on the entire back surface of the suspension-board-with-circuit assembly sheet 1, the photosensitive dry film resist is exposed to light and then developed.

Then, the metal supporting board 17 exposed from the etching resist 15 is removed by etching, as shown in FIG. 6(f). The etching is performed by a wet etching method (a chemical etching method) in which, for example, aqueous ferric chloride used as an etching solution is sprayed onto the metal supporting board 17 or the metal supporting board 17 is dipped in the etching solution.

Then, the etching resist 15 is removed by etching or by stripping, as shown in FIG. 6(g).

As a result, the gimbals 10 of the respective suspension boards with circuits 2, the openings 19 of the respective distinguishing marks 3, and the respective slits 14 of the supporting sheet 4 can be formed simultaneously. The suspension-board-with-circuit assembly sheet 1 in which the respective suspension boards with circuits 2, the respective distinguishing marks 3, and the supporting sheet 4 are formed can be produced in the manner described above.

The metal plated layer (not shown) formed of gold is formed on the front surfaces of the magnetic-head-side connecting terminals 12 and external connecting side terminals 13 and on the front surfaces of the non-defectiveness marks 29.

Thereafter, defectiveness of the suspension-board-with-circuit assembly sheet 1 is judged by inspecting on whether or not the conductive pattern 8 of the respective suspension board with circuit 2 contains a broken wire, first. The presence of the broken wire of the conductive pattern 8 is judged, for example, by optically detecting contrast between the conductive pattern 8 and the insulating cover layer 9.

Then, when the suspension board with circuit 2 is judged defective by the inspection, the removable portion 20 of the distinguishing mark 3 corresponding to the suspension board with circuit 2 is removed.

The removable portion 20 is removed, for example, by punching using a punch or stamping using male and female metal stamp tools, or by vacuuming using a vacuum suction machine.

In the case of the suspension board with circuit 2 whose conductive pattern 8 contains a broken wire, the corresponding removable portion 20 of the distinguishing mark 3 is removed. Accordingly, the defectiveness of the suspension board with circuit 2 can be confirmed from a visual observation of the distinguishing mark 3 from which the removable portion 20 is removed.

On the other hand, in the case of the suspension board with circuit 2 whose conductive pattern 8 contains no broken wire, the corresponding removable portion 20 of the distinguishing mark 3 remains. Accordingly, the non-defectiveness of the suspension board with circuit 2 can be confirmed from a visual observation of the non-defectiveness mark 29 of the removable portion 20.

According to the suspension-board-with-circuit assembly sheet 1, since the joint portions 22 for joining the removable portion 20 and the supporting sheet 4 are formed of resin, when the removable portion 20 is removed to indicate that the suspension board with circuit 2 is defective, the removal portion 20 in the opening 19 can be removed from the supporting sheet 4 with ease by simply cutting the joint portions 22.

In addition, since no metal powder is generated when the joint portions 22 are cut off, the electrical property of the suspension board with circuit 2 can be maintained well. Further, when the removal portion 19 is removed by stamping out using male and female metal stamp tools, the male and female stamp tools can be reduced in abrasion. As a result of these, easy and reliable removal of the removal portion 20 can be provided, and hence the suspension board with circuit 2 of high connecting reliability can be obtained.

Further, according to the suspension-board-with-circuit assembly sheet 1, the suspension board with circuit 2 and the supporting sheet 4 can both be formed from the common metal supporting layer 6 simultaneously. Still further, the suspension board with circuit 2 and the joint portions 22 can both be formed from the common insulating base layer 7 and the common insulating cover layer 9 simultaneously. As a result of this, the production processes can be simplified and the suspension-board-with-circuit assembly sheet 1 can be produced with an increased production efficiency.

Further, since the curved portion is formed in the supporting-sheet-side end portion 24 of the joint portion 22 and the removable-portion-side end portion 25 of the joint portion 22, when the supporting-sheet-side end portion 24 and the removable-portion-side end portion 25 are stressed, the stress can be dispersed over the curved portion. On the other hand, when the removable portion 20 is intended to be removed, the joint portions 22 can be cut off on the inner side, or on the joint center portions 34 by exerting stress on inward portions thereof, or on the joint center portions 34 in the direction in which the supporting-sheet-side end portion 24 and the removable-portion-side end portion 25 are opposite to each other. Thus, when the removable portion 20 is not intended to be removed, it can the joint portions 22 can be cut off difficulty, while on the other hand, when the removable portion 20 is intended to be removed, the joint portions 22 can be cut off reliably.

In addition, since the outer frame portion 21 is formed to expose the peripheral end portion 35 of the opening 19 in the supporting sheet 4, the joint portions 22 extending continuously with the outer frame portion 21 can be cut off at the exposed peripheral end portion 35 of the opening 19 with ease and reliability.

Figure 7:
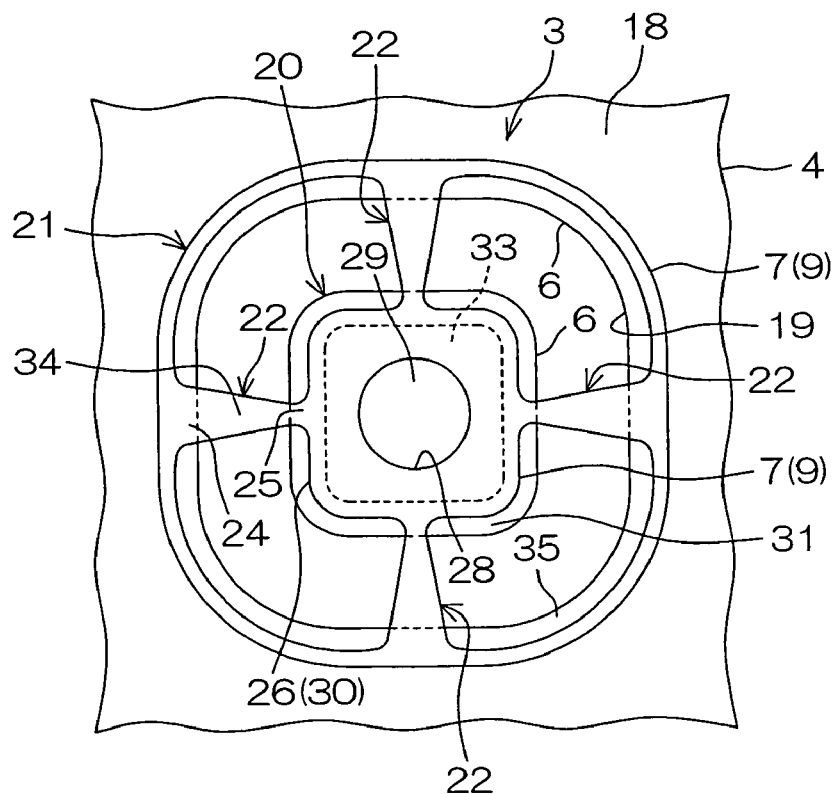
FIG. 7 is an enlarged plan view showing a distinguishing mark of a suspension-board-with-circuit assembly sheet of another embodiment (a second embodiment) of the wired-circuit-board assembly sheet of the present invention.
Figure 8:
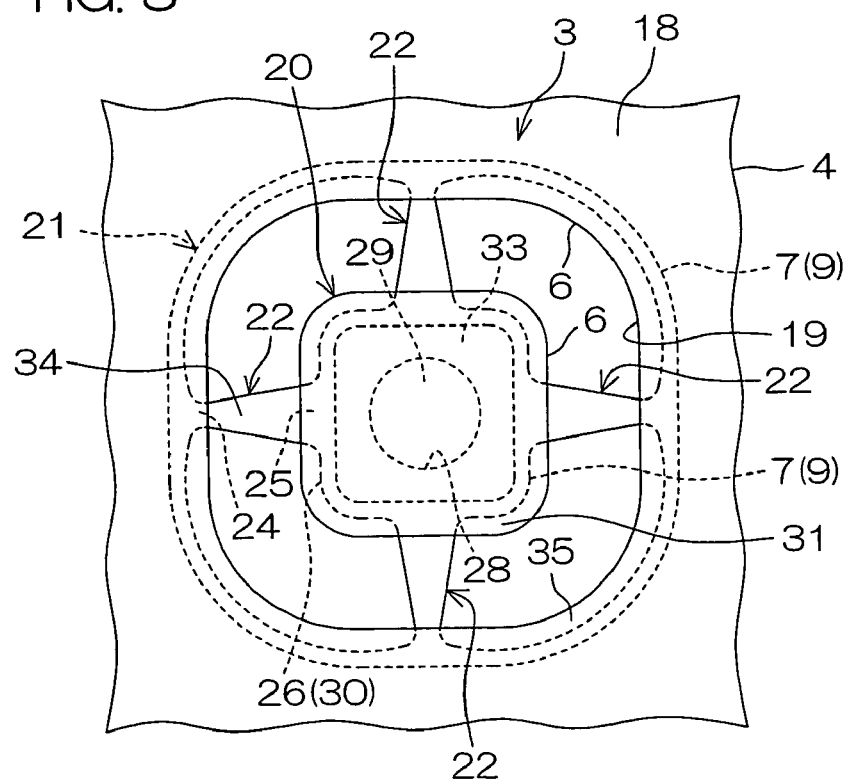
FIG. 8 is an enlarged rear view showing a distinguishing mark of a suspension-board-with-circuit assembly sheet of still another embodiment (a third embodiment) of the wired-circuit-board assembly sheet of the present invention.
Figure 9:
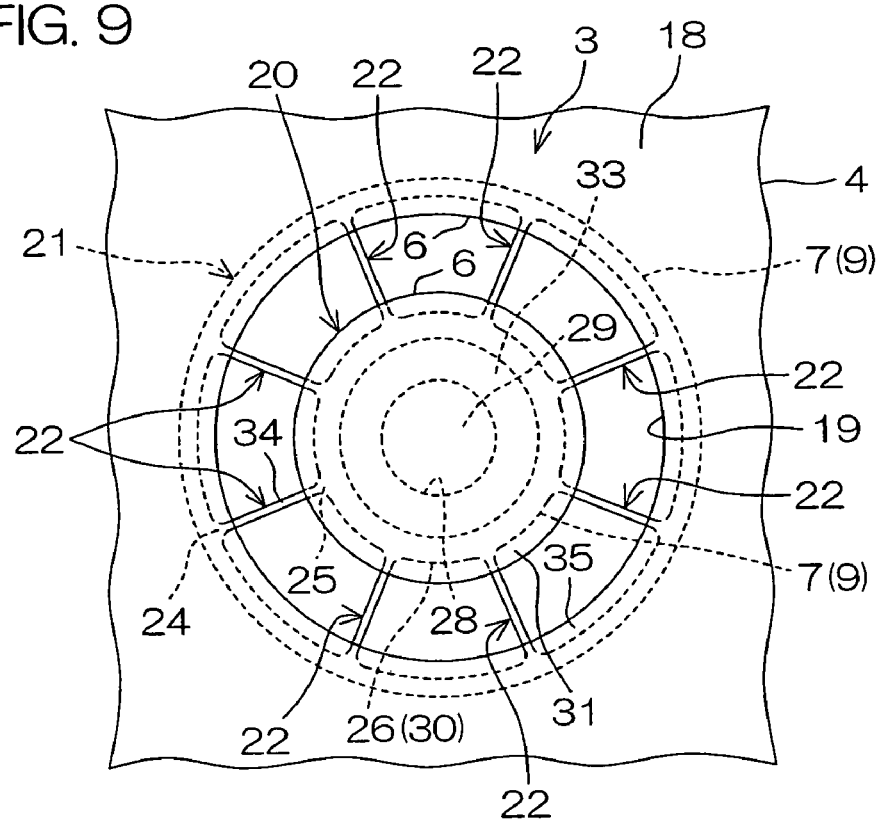
FIG. 9 is an enlarged rear view showing a distinguishing mark of a suspension-board-with-circuit assembly sheet of a further embodiment (a fourth embodiment) of the wired-circuit-board assembly sheet of the present invention.
Figure 10:
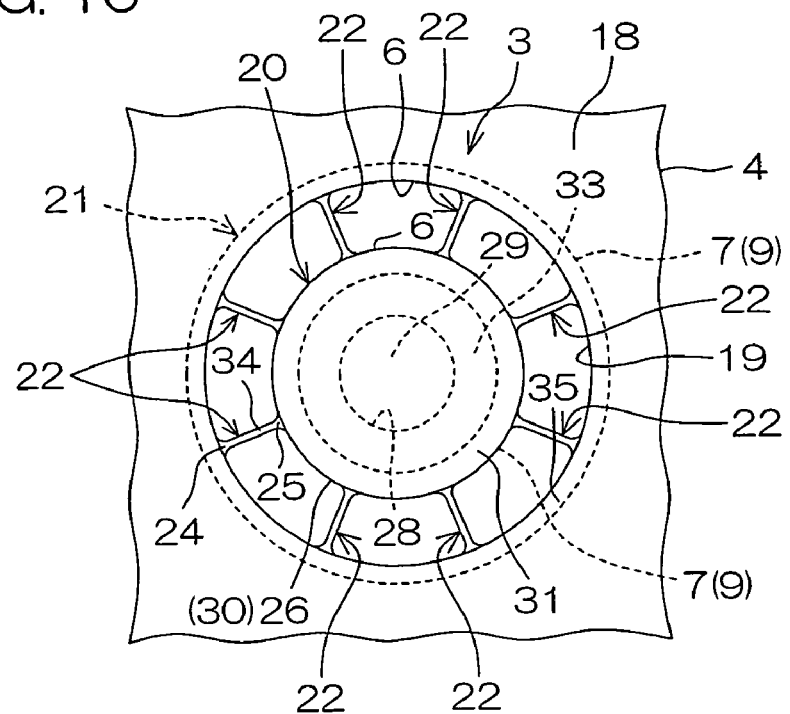
FIG. 10 is an enlarged rear view showing a distinguishing mark of a suspension-board-with-circuit assembly sheet of a still further embodiment (a fifth embodiment) of the wired-circuit-board assembly sheet of the present invention.

FIG. 7 is an enlarged plan view showing a distinguishing mark of a suspension-board-with-circuit assembly sheet of another embodiment (a second embodiment) of the wired-circuit-board assembly sheet of the present invention. FIG. 8 is an enlarged rear view showing a distinguishing mark of a suspension-board-with-circuit assembly sheet of still another embodiment (a third embodiment) of the wired-circuit-board assembly sheet of the present invention. FIG. 9 is an enlarged rear view showing a distinguishing mark of a suspension-board-with-circuit assembly sheet of a further embodiment (a fourth embodiment) of the wired-circuit-board assembly sheet of the present invention. FIG. 10 is an enlarged rear view showing a distinguishing mark of a suspension-board-with-circuit assembly sheet of a still further embodiment (a fifth embodiment) of the wired-circuit-board assembly sheet of the present invention. Parts and members corresponding to those described above are labeled by the same reference numerals and the detailed description thereon will be omitted.

Referring now to FIGS. 7 to 10, other suspension-board-with-circuit assembly sheets of other embodiments of the present invention will be described.

Although the joint center portions 34 of the joint portions 22 formed equal in width in the description mentioned above, the joint center portions 34 of the joint portions 22 can be tapered to gradually decrease in width from the supporting-sheet-side end portion 24 to the removable-portion-side end portion 25, for example, as shown in FIG. 7.

In the case where the joint center portions 34 of the joint portions 22 are formed equal in width, when the removable portions 20 are removed, the locations where the joint center portions 34 are cut may vary, so that it may be difficult to remove and deal with the removable portions 20 in uniformity.

However, when the joint center portions 34 of the joint portions 22 are tapered to generally decrease in width from the supporting-sheet-side end portion 24 to the removable-portion-side end portion 25, they can be easily cut off at the removable-portion-side end portions 25 in uniformity. Thus, the removable portions 20 can be removed and dealt with in uniformity.

Alternatively, the joint center portions 34 of the joint portions 22 can be tapered in to gradually decrease in width from the removable-portion-side end portion 25 to the supporting-sheet-side end portion 24, for example, as shown in FIG. 8.

In the case where the joint center portions 34 of the joint portions 22 are formed equal in width, it may be difficult to remove and deal with the removable portions 20 in uniformity, as mentioned above.

However, when the joint center portions 34 of the joint portions 22 are tapered to generally decrease in width from the removable-portion-side end portion 25 to the supporting-sheet-side end portion 24, they can be easily cut off at the supporting-sheet-side end portions 24 in uniformity. Thus, the removable portions 20 can be dealt with in uniformity.

Although the removable portions 20, the openings 19, and the outer frame portions 21 are formed in a generally square shape having rounded corners as viewed from top, in the description above, the removable portions 20, the openings 19, and the outer frame portions 21, respectively, can be formed in a generally circular shape to gradually increase in diameter as viewed from top, as shown in FIG. 9.

A plurality (eight) of joint portions 22 of the distinguishing marks 3 are arranged to extend radially towards the outer frame portion 21 centering around the non-defectiveness mark 29 of the removal portion 20.

Although the margin exposed from the insulating base layer 7 and the margin exposed from the insulating cover layer 9 are provided in the marginal portion 31 of the metal supporting layer 6 at the removable portions 20 and the marginal portion 35 of the opening 19 of the metal supporting layer 6 in the metal supporting sheet 4, respectively, in the embodiment described above, the margins may be eliminated, as shown in FIG. 10. In other words, the marginal portion 31 of the metal supporting layer 6 at the removable portion 20 can be formed without being exposed from the insulating base layer 7 and the insulating cover layer 9 and also the marginal portion 35 of the opening 19 of the metal supporting layer 6 in the metal supporting sheet 4 may be formed without being exposed from the outer frame portion 21.

Although the removal portion 20 is removed when the suspension board with circuit 2 is judged defective in the description above, the removable portion 20 can be removed when the suspension board with circuit is non-defective.

In this case, when the suspension board with circuit 2 is judged defective, the related removable portion 20 of the distinguishing mark 3 corresponding to each suspension board with circuit 2 remains. Accordingly, the defectiveness of the suspension board with circuit 2 can be confirmed from the remaining removable portion 20.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired-circuit-board assembly sheet, comprising:
    a plurality of wired circuit boards;
    distinguishing marks provided for distinguishing defectiveness of the wired circuit boards; and
    a supporting sheet comprising a metal supporting layer for supporting the wired circuit boards and the distinguishing marks;
    wherein openings are formed in the supporting sheet where the distinguishing marks are provided,
    wherein the distinguishing marks include removable portions provided in the openings for indicating whether the wired circuit boards are defective or non-defective, and a plurality of spoke-shaped, resin joint portions extending from each of the removable portions and for joining each of the removable portions and the supporting sheet, and
    wherein the joint portions are formed of only resin and are devoid of metal, such that when the removable portions are removed from the supporting sheet the joint portions are operative to be severed without any generation of metal powder.

2. The wired-circuit-board assembly sheet according to claim 1, wherein each of the wired circuit boards comprises:
    the metal supporting layer;
    an insulating base layer formed on the metal supporting layer;
    a conductive pattern formed on the insulating base layer; and
    an insulating cover layer formed on the insulating base layer to cover the conductive pattern,
    and
    the joint portion comprises the insulating base layer and/or the insulating cover layer.

3. The wired-circuit-board assembly sheet according to claim 1, wherein each of the joint portions comprises:
    a supporting-sheet-side end portion connected to the supporting sheet; and
    a removable-portion-side end portion connected to the removable portion,
    wherein at least either of the supporting-sheet-side end portion and the removable-portion-side end portion has a curved portion formed to generally increase in width from inside to outside in a curved form in a direction in which the supporting-sheet-side end portion and the removable-portion-side end portion are opposite to each other.

4. The wired-circuit-board assembly sheet according to claim 1, wherein each of the distinguishing marks further comprises an outer frame portion formed of resin which is provided to extend continuously from the joint portion to surround the opening,
    wherein the outer frame portion is formed to expose an end portion of the opening in the supporting sheet.

5. The wired-circuit-board assembly sheet according to claim 1, wherein each of the joint portions comprises: a supporting-sheet-side end portion connected to the supporting sheet; and a removable-portion-side end portion connected to the removable portion,
    and which are formed to generally decrease in width from the supporting-sheet-side end portion to the removable-portion-side end portion or from the removable-portion-side end portion to the supporting-sheet-side end portion.

6. The wired-circuit-board assembly sheet according to claim 1, wherein each of the wired circuit boards is a suspension board with circuit.

* * * * *